United States Patent [19]

Weiner et al.

[11] 3,813,608

[45] May 28, 1974

[54] AMPLIFIER DEVICE

[75] Inventors: Maurice Weiner, Ocean Township; John L. Carter, Ocean; Sol Schneider, Little Silver, all of N.J.

[73] Assignee: The United States of America as represented by the Secretary of the Army, Washington, D.C.

[22] Filed: Mar. 6, 1973

[21] Appl. No.: 338,477

[52] U.S. Cl. .......................... 330/34, 315/4, 315/9, 330/56

[51] Int. Cl. .......................... B03f 3/10

[58] Field of Search .......... 330/33, 34, 43, 44, 56; 313/64, 65 AB, 70 R, 71; 331/96, 101; 315/3, 4, 5.24, 9

[56] References Cited

UNITED STATES PATENTS 3,733,510 5/1973 Fischer .......................... 313/65 AB

*Primary Examiner*—Herman Karl Saalbach
*Assistant Examiner*—James B. Mullins
*Attorney, Agent, or Firm*—Edward J. Kelly; Herbert Berl; Daniel D. Sharp

[57] ABSTRACT

An electron beam semiconductor amplifier device having at least one array of parallelly connected, back-biased semiconductor target diodes of impedance low compared with that of the amplifier load disposed along a wave energy transmission means at a region thereof of impedance substantially equal to that of each of the target diodes. Each diode is disposed within a separate electron discharge device which further contains an electron gun and beam modulating means for directing a high energy, current-modulated electron beam onto said enclosed target diode. Each said electron discharge device has a portion extending externally of the grounded envelope for removably mounting said electron discharge device to an enlarged portion of one of the conductors of the transmission means. The beam electrons from each separate electron discharge device penetrate into the depletion region of the diode adjacent the bombarded surface. The interaction of the beam with the semiconductor diodes in each of the electron discharge devices produces an amplified current in a load circuit common to said diodes which is a function of the electron beam current in that electron discharge device. Wave energy generated by the current induced in each of the diodes by the impinging electron beam in the several electron discharge devices propagates along the transmission means to the load. The impedance of the transmission means can be varied progressively as the load is approached, to facilitate impedance matching of the low impedance diodes and the amplifier load.

7 Claims, 3 Drawing Figures

AMPLIFIER DEVICE

SUMMARY OF THE INVENTION

Electron beam semiconductor amplifiers are known which rely upon the principle of electron beam ionization of certain solid state devices. One such device is a shallow pn junction diode which, in the absence of electron bombardment, has small conduction for reverse voltages below the avalanche breakdown voltage. When such a diode is reverse biased, the depletion region of the pn or np junction will extend throughout the semiconductor, thereby establishing a high-field drift region essential for rapid collection of injected carriers without large standing currents in the device. Such a semiconductor device essentially comprises a metal film-electrode-semiconductor-metal electrode film structure with a very shallow p-n or n-p junction close to one of the metal contacts.

By bombarding one of the metal electrodes of such a reverse-biased solid state device with an accelerated electron beam having an energy of the order of 10KeV, most of the electrons from the beam penetrate the metal electrode and enter the semiconductor target diode with considerable energy. These electrons reach the depletion region of the solid state target diode and electron-hole pairs are created. Owing to the very shallow p-n or n-p junction, the hole-electron pairs are created in the semiconductor target diode in a region of high electric field, so that these carrier pairs are rapidly separated, and the possibility of recombination is quite low. For this reason, one electronic charge will flow through an external circuit for each electron-hole pair created. The current gain for such a target diode, defined as the ratio of the semiconductor target current and the electron beam current, is equal to the number of carrier pairs created per beam electron entering the semiconductor with electron bombardment energy $W_b$.

For a semiconductor target diode of silicon with an aluminum contact layer 1000A ($10^{-7}$ meters) thick, it has been found that the current gain $G$ is given approximately by $$G = (W_b - 2\text{KeV})/(3.6\text{eV})$$

The 2KeV term in the numerator represents the approximate energy loss in penetrating the metallic contact layer. The 3.6eV term in the denominator represents the energy dissipated in creating each of the electron-hole pairs; this term is somewhat material-dependent. For a beam with energy of 10KeV, the current gain becomes (1,000 − 2,000/3.6) or approximately 2,220.

The output power of the semiconductor target diode begins to saturate when the electric field across the diode is reduced to a low value in the drift region, occurring because of low device voltage or carrier space charge effects.

These effects of current reduction owing to both carrier space charge effects and to device voltage reduction generally combine to determine the output capability of the semiconductor target diode. It has been shown that the maximized power output $P_{0\,max}$, in watts, of the semiconductor target diode, is approximated by the following expression $$P_{0\,max} = 2160\,[(\delta_o/10^7)\,(r/11.5)^{4}]^{(6/7)}\,(50/Z_L)$$

where $\delta_o$ is the charge carrier drift velocity expressed in $10^7$ cm/sec., $(r/11.5)$ is the dielectric constant of the semiconductor material (silicon), A is the area, in square millimeters, of the base of the semiconductor target diode bombarded by the electron beam and $Z_L$ is the load impedance in ohms.

The expression indicates that, for a given semiconductor material, the area should be increased and the load impedance reduced, in order to increase current and power. Material and fabrication problems impose a limitation on the area of a semiconductor target device. Moreover, the minimum transmission line impedance is restricted by dimension tolerances and by the characteristic impedance of the driven load (antenna, etc.).

The invention discloses a technique for eliminating both of these restrictions by providing means for increasing the total semiconductor target area and by permitting the semiconductor target to look into a relatively small impedance. In the device of the invention one or more circular arrays of several semiconductor target diodes are provided so that the area of the semiconductor target impinged upon by the electron beam is effectively increased. Each target diode is excited by a single longitudinally directed solid electron beam. The semiconductor diodes are disposed at or near one end of a coaxial transmission line between the inner and outer conductors thereof.

The current induced in each diode by the electron beam generates a radial wave that propagates along the coaxial line to the load at any convenient impedance, such as 50 ohms. The impedance of the coaxial transmission line in the region of the semiconductor target diodes is made small to match the low impedance of the diodes. The impedance of the coaxial transmission means is inversely proportional to the spacing between inner and outer conductors, so that the spacing between conductors is relatively small in the region of the coaxial line across at which the diodes of relatively low impedance are placed. The spacing between the conductors of the coaxial transmission means can be progressively increased, or increased in steps, in the direction of the load, so that the proper impedance transformation between the diodes and the load is attained.

The invention also permits electron beam bombardment of the target diodes in the diode array or arrays without requiring evacuation of the coaxial transmission means and permits each target diode to constitute part of a self-contained evacuated electron discharge device which is removably mounted to the coaxial transmission means. This is accomplished by placing each one of the diodes of the one or more arrays of diodes of the amplifier device within a separate electron discharge device which contains within its evacuated envelope an electron gun and beam modulating means for directing the high energy, current modulated electron beam onto the enclosed target diode. A lead-in extending through the electron discharge device envelope provides the necessary external connection to the target diode. Each electron discharge device has a mounting portion external of the evacuated envelope which can be removably mounted to an enlarged portion of one of the conductors of the coaxial transmission means. For example, the mounting portion of the electron discharge device may be threaded and screwed into threaded apertures in a conductor of the coaxial transmission means. If the electron discharge device is mounted to the inner conductor of the coaxial transmission means, the target diode lead-in can be connected, as by a short conductive tab, to the outer conductor of the coaxial transmission means. If, on the other hand, the electron discharge device is mounted to the outer conductor of the coaxial transmission means, the target diode is connected to the inner conductor of the coaxial transmission means and the target diode lead-in connected to the inner conductor. In this manner, each of the target diodes are connected between the inner and outer conductors of the coaxial transmission means in parallel with the other target diodes.

In this manner, the means for generating the electron beam and for directing said beam upon the target diode can be simplified and each electron discharge device can be regarded as a plug-in unit which is readily replaceable in the event of a fault in some portion of the target diode or beam generating and directing mechanism. For example, if one of the parallelly connected target diodes becomes leaky, the amplifier device would become inoperative. By simply replacing the electron discharge device containing the faulty target diode, operation can be readily resumed, without affecting other components of the amplifier device.

The amplifying device can be designed to perform as a Class A amplifier, in which case a single array of electron discharge devices, each containing a target diode, is removably mounted on one of the conductors of the coaxial line, or on an extension thereof. Alternatively, the amplifier device can be adapted for the more efficient Class B operation by mounting two concentric arrays of electron discharge devices, each containing a target diode, to the coaxial transmission means; for example, one array of electron discharge devices can be mounted onto an enlarged portion of the outer conductor, while mounting the other array of electron discharge devices onto the outer conductor. The back-biased diodes of a given array can be electrically connected to the outer conductor of the coaxial transmission means by suitable connecting means. If a single biasing supply is to be used for both diode arrays, the electron discharge devices of one array will contain diodes of opposite conductivity to that of the diodes in the electron discharge devices of the other array.

Another advantage of using separate electron tubes for each of the target diodes is that each electron beam can be of relatively small cross section. Modulation of such an electron beam is considerably less difficult that would be modulation of a single beam of diameter sufficient to bombard all target diodes simultaneously. Since the diameter of the electron tubes is small compared to the wavelength, as contrasted with the diameter of an array of diodes mounted adjacent the periphery of a radial waveguide, particularly at lower frequencies, there is little phase variation among the individual target diodes.

DESCRIPTION OF THE PREFERRED EMBODIMENT

Figures 1, 2:
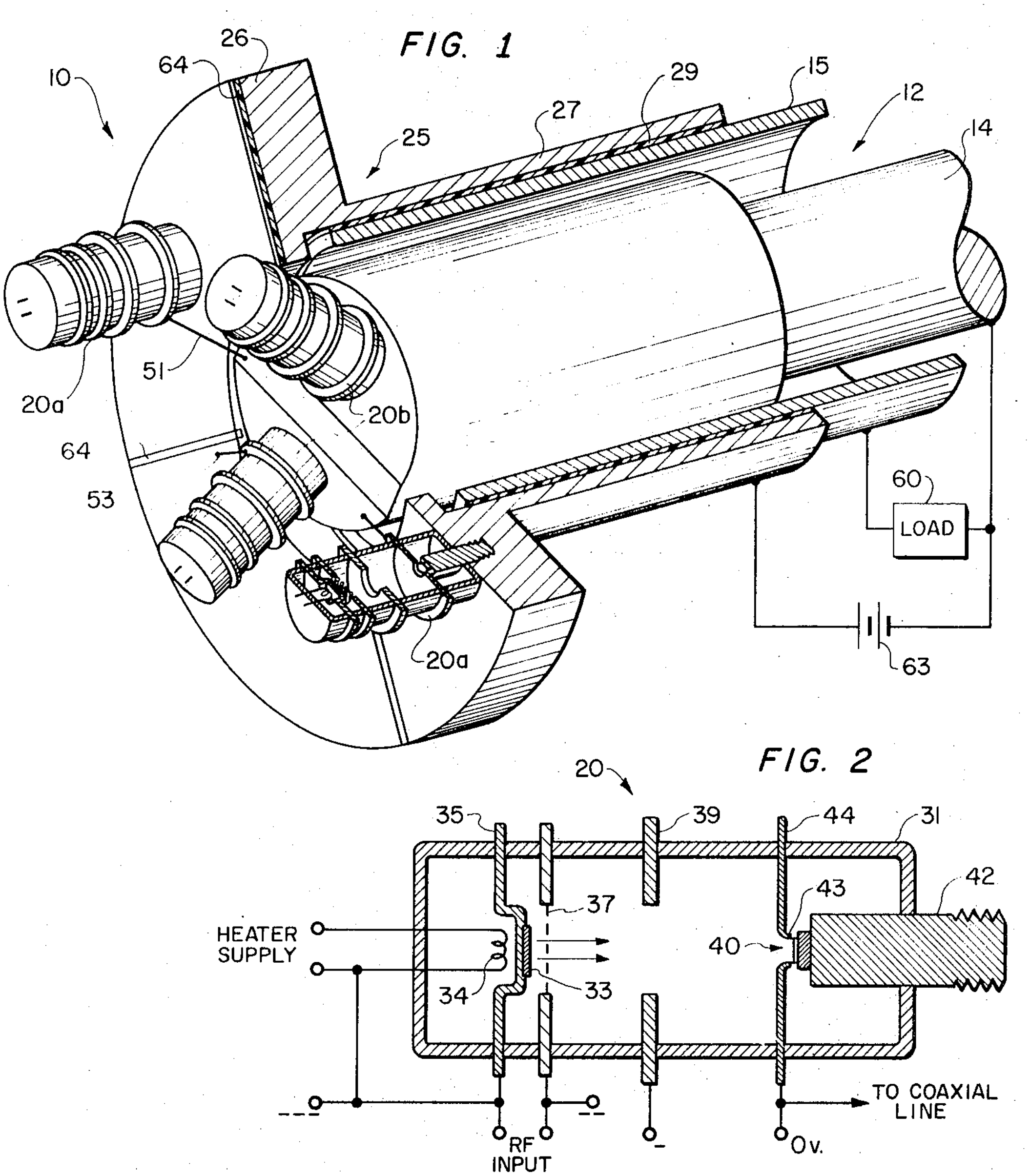
FIG. 1 is a view showing an amplifier according to the invention.
FIG. 2 is a view illustrating the manner of exciting diodes of different arrays.

The amplifier 10 of the invention is illustrated in FIG. 1 and includes a plurality of electron discharge devices (tubes) **20*a* and 20*b* mounted on a coaxial transmission line 12 having an inner conductor 14 and an outer conductor 15. The outer conductor 15 typically is a relatively thin tubular member. Although not shown in FIG. 1, the conductors 14 and 15 of the coaxial transmission line both can be of reduced inner diameter at the load end for insertion of a standard output connector. In order to permit operation of the amplifier device over a wide frequency band, the inner conductor 14 also can be provided with two or more stepped regions of decreasing cross-sectional area to effect transformation of impedance over the region between that portion of the coaxial transmission line occupied by the electron discharge devices 20*a* and 20*b* and the coaxial output connector; two such regions 14*a* and 14*b* of differing cross section are indicated in FIG. 1, although many number of such regions, including one, can be used. In practice, the inner conductor usually is of solid construction, since one end thereof then can be used to directly support one array of electron discharge devices 20*b*** and since the transitions in cross section can be more readily machined from solid bar stock.

In order to mount an array of electron discharge devices **20*a* on the outer conductor 15, a support assembly 25 is provided which includes an enlarged collar 26 and a tubular extension 27. The combined length of member 25 is approximately an integral odd number of quarter wavelengths at the operating frequency of the amplifier device 10. The assembly 25, in addition to facilitate supporting the electron discharge devices 20*a*, serves to enhance the coupling of rf energy between the inner and outer conductors 14 and 15. A cylindrical electrically insulating layer 29 disposed between the tubular extension 27 and the outer conductor 15 serves to prevent direct current bias current flow through the load 60, which load is connected between the inner conductor 14 and the outer conductor 15 of the coaxial transmission means 12** at one end thereof. It is possible to provide the outer conductor with an integral enlarged portion or with an enlarged portion attached, as by screws, directly to the outer conductor.

Figure 4:
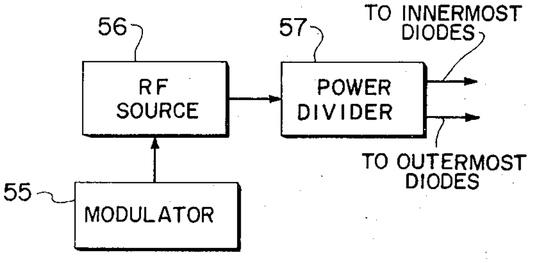
FIG. 4 is a view illustrating a typical construction of the diode used within each of the electron discharge devices of FIG. 3.
Figure 3:
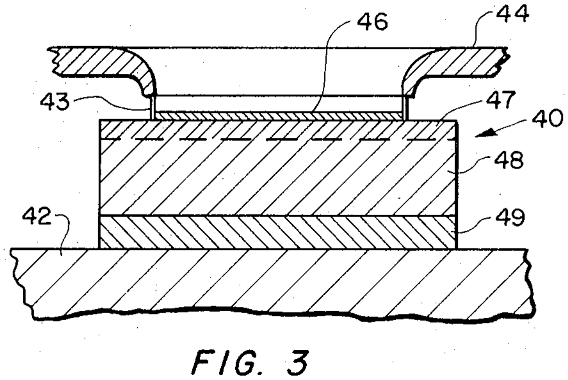
FIG. 3 is a section view of one of the electron discharge devices used in the amplifier device of FIG. 1.

The details of the electron discharge devices **20*a* and 20*b* are shown in FIG. 3. Contained within the evacuated envelope 31 is a cathode 33 which can be heated indirectly by a heater 34, and supported by a cathode electrode 35 mounted within the tube envelope 31. The electron beam emitted from the cathode 35, indicated in FIG. 1 by dashed lines, is controlled by a grid 37 and accelerated and focussed by an annular electrode 39 maintained positive with respect to the cathode. The semiconductor target diode 40 is mounted on a mounting member 42 which extends through the evacuated envelope 31 and is threaded at one end thereof. The target diode 40 is connected by short electrically conducting tabs 43 to an annular target diode mounting member 44 which is mounted within the tube envelope 31. As shown in FIG. 4, the target diode 40 includes a thin metal electrode 46, which, for example, can be a 0.1 micron layer of aluminum deposited upon one face of the target diode 40. Adjacent the metal layer 46 is a region of the target diode 47 which is of P+ conductivity type. The target diode 40 also includes the region 48** of *n* conductivity type and the region 49 of *n*+ conductivity type. In a typical target diode 40, the regions 47, 48 and 49 have a thickness of the order of 0.25 microns, 25 microns and 25 microns, respectively. The width of the target diode 40 can be of the order of 2 millimeters and the cross-sectional dimension of the mounting member 42 can be of the order of 5 millimeters. The mounting member 42, which is made of an electrically conductive material, such as copper, forms a heat sink and also serves as one of the electrodes for target diode 40.

The heater 34 is connected to an appropriate heater supply, one terminal of which may be maintained at a highly negative potential relative to the target diode electrode 46, for example, 0 volts or some other relatively low reference potential. The target diode electrode 46 is connected to the appropriate conductor of the coaxial transmission line 12 by a lead wire, as shown in FIG. 1.

The amplifier device shown in FIG. 1 is capable of Class B operation. The diodes **20*b* of the inner array of diodes are threadably mounted to the inner conductor 14 and the electrode 46 of each of the electron tubes 20*b* of this inner array is connected to the collar 26 of outer conductor assembly 25 by lead wire 51. The end of the inner conductor into which the electron tubes 20*b* are inserted may be chamfered, as shown in FIG. 1, to provide a bit more space between adjacent electron tubes. The electron tubes 20*a* in the outer array, or the other hand, threadably engage the collar 26 of outer conductor assembly 25 and the electrode 46 of each of the diodes of the outermost electron tubes 20*a* is connected to the inner conductor 14 by a lead wire 53. An r.f. input for modulating the electron beam current is connected between the cathode electrode 33 and the grid electrode 37**.

When two arrays of diodes, viz., the diodes of electron tubes **20*a* and 20*b* are used for Class B operation, a modulation driver circuit such as shown in FIG. 4 is used. Density modulation of the electron beam in each of the tubes can be effected by a modulator 55 coupled to the r.f. source 56. The modulated r.f. signal from r.f. source 55 then is split into two separate outputs by power divider 57, with one output being instantaneously 180 degrees out of phase with the other output. One output of the power divider 57 is connected to the target diode mounting members 44 of the innermost array of electron tubes 20*b*, while the other output of the power divider 57 is supplied to the respective target diode mounting members 44 of the innermost array of electron tubes 20*a*. For Class A operation, only one array of electron tubes may be needed, in which case, the power divider 57 would be dispensed with. It is possible, of course, to use two arrays of electron discharge devices for Class A operation, in order to obtain greater power output. In such an application, the conductivity types of the contained diodes 40 would be of different conductivity type in the two arrays of tubes 20**.

Each of the diodes 40 of the electron tubes **20*a* and 20*b* are reverse biased by means of the direct current bias source 63 which is connected between the outer conductor tubular extension 27 and the inner conductor 14 of the coaxial line 12. The collar 26 is provided with radial slots which can be filled with resistive material 64 in order to prevent undesirable radial r.f. current flow between electron tubes of different arrays. If the diodes 40 of the inner array of electron discharge tubes 20*b* are of opposite conductivity type to that of the diodes 40 of the array of electron discharge devices 20*a*, a single biasing source 63 can be used for both arrays. If the conductivity type of the diodes of the two arrays of tubes is the same, it would be necessary to replace the single reverse biasing source 63** by two separate biasing sources of opposite polarity, one for each array of tubes.

Many other variations of the present invention obviously are possible in view of the above description. It is intended, therefore, that the scope of the present invention is not limited to those embodiments and modifications shown, but that it is to be limited only by the appended claims.

What is claimed is:

1. A solid state amplifying electron device for supplying wave energy to a load comprising wave energy transmission means;

a plurality of angularly arranged electron discharge devices each containing a reverse-biased semiconductor diode and each removably mounted to said transmission means at a region of impedance substantially equal to that of each of said diodes;

said electron discharge device each containing means for generating an electron beam and means for directing said electron beam upon said respective diode at relatively high energy;

each of said diodes having electrodes formed on opposed surfaces thereof one of which electrodes is pervious to said beam electrons, each of said diodes further having a depletion region adjacent said one electrode which is accessible to beam electrons impinging upon said diode, each of said electron discharge devices being provided with means for selectively directing each of said electron beams upon the corresponding contained diode in response to an appropriate input control signal, each of said diodes having a radio frequency current induced therein when impinged upon by said beam electrons, said diode current flow generating wave energy which is propagated along said wave energy transmission means.

2. A solid state amplifying electron device according to claim 1 wherein each of said electron discharge devices comprise an evacuated envelope from which extends a mounting element, said mounting element removably engaging said transmission means.

3. A solid state amplifying electron device according to claim 2 wherein said transmission means includes coaxially arranged inner and outer conductors and wherein the mounting element of each of said electron discharge devices is removably attached directly to one of said conductors.

4. A solid state amplifying electron device according to claim 2 further including wave energy coupling means for capacitively coupling said inner and outer conductors, unidirectional bias supply means for each of said diodes, said coupling means including means for isolating said load from said bias supply means.

5. A solid state amplifying electron device according to claim 4 wherein said coupling means includes an enlarged portion to which said mounting elements are removably attached.

6. A solid state amplifying electron device according to claim 5 wherein said coupling means is an odd number of quarter wavelengths long at the mean operating frequency of said device.

7. A solid state amplifying electron device according to claim 6 wherein a first group of said electron devices are mounted to said enlarged portion of said coupling means and a second group of said electron discharge devices are mounted to said inner conductor.

* * * * *